(12) United States Patent
Ando

(10) Patent No.: US 8,586,992 B2
(45) Date of Patent: Nov. 19, 2013

(54) SEMICONDUCTOR DEVICE

(75) Inventor: Yuji Ando, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/360,589

(22) Filed: Jan. 27, 2012

(65) Prior Publication Data

US 2012/0217505 A1 Aug. 30, 2012

(30) Foreign Application Priority Data

Feb. 28, 2011 (JP) ................................ 2011-041277

(51) Int. Cl.
*H01L 29/778* (2006.01)

(52) U.S. Cl.
USPC ......................................................... 257/76

(58) Field of Classification Search
USPC ......................................................... 257/76
See application file for complete search history.

(56) References Cited

U.S. PATENT DOCUMENTS

| | | | |
|---|---|---|---|
| 4,833,508 A * | 5/1989 | Ishikawa et al. ................ 257/24 |
| 6,281,528 B1 * | 8/2001 | Wada ............................ 257/200 |
| 6,552,373 B2 | 4/2003 | Ando et al. |
| 7,291,872 B2 * | 11/2007 | Hikita et al. .................. 257/192 |
| 8,035,130 B2 * | 10/2011 | Nanjo et al. ................... 257/194 |
| 8,084,781 B2 * | 12/2011 | Udagawa ....................... 257/103 |
| 8,344,419 B2 * | 1/2013 | Kikkawa ....................... 257/192 |
| 2001/0020700 A1 * | 9/2001 | Inoue et al. ..................... 257/20 |
| 2002/0036287 A1 * | 3/2002 | Yu et al. ......................... 257/20 |
| 2005/0133816 A1 * | 6/2005 | Fan et al. ...................... 257/190 |
| 2006/0255366 A1 * | 11/2006 | Sheppard et al. ............. 257/194 |
| 2006/0261371 A1 * | 11/2006 | Kuroda et al. ................ 257/194 |
| 2006/0281238 A1 * | 12/2006 | Harris et al. ................... 438/172 |
| 2007/0207626 A1 * | 9/2007 | Nishi ............................. 438/758 |
| 2008/0121927 A1 * | 5/2008 | Matocha et al. .............. 257/183 |
| 2009/0045438 A1 * | 2/2009 | Inoue et al. ................... 257/192 |
| 2009/0072243 A1 * | 3/2009 | Suda et al. ....................... 257/77 |
| 2009/0189205 A1 * | 7/2009 | Ohki ............................. 257/288 |
| 2009/0218599 A1 * | 9/2009 | Mishra et al. ................. 257/194 |

(Continued)

FOREIGN PATENT DOCUMENTS

JP 2001-274375 A 10/2001

OTHER PUBLICATIONS

Umesh K. Mishra et al., "AlGaN/GaN HEMTs—An Overview of Device Operation and Applications", Proceedings of the IEEE, vol. 90, No. 6, Jun. 2002, pp. 1022-1031.

(Continued)

*Primary Examiner* — Thao P. Le
(74) *Attorney, Agent, or Firm* — McGinn Intellectual Property Law Group, PLLC

(57) ABSTRACT

A semiconductor device including a field effect transistor having a buffer layer subjected to lattice relaxation, a channel layer, and an electron supply layer formed in this order with group-III nitride semiconductors respectively in a growth mode parallel with a [0001] or [000-1] crystallographic axis over a substrate and having a source electrode and a drain electrode, those being coupled electrically to the channel layer, and a gate electrode formed over the electron supply layer, in which, in the buffer layer and the electron supply layer, a layer existing on the group-III atomic plane side of the channel layer has an A-axis length larger than a layer existing on the group-V atomic plane side of the channel layer; and the electron supply layer has a bandgap larger than the channel layer.

24 Claims, 10 Drawing Sheets

(56) References Cited

U.S. PATENT DOCUMENTS

| | | | |
|---|---|---|---|
| 2009/0280634 A1* | 11/2009 | Onodera et al. | 438/597 |
| 2010/0038680 A1* | 2/2010 | Nakayama et al. | 257/190 |
| 2010/0230684 A1* | 9/2010 | Okamoto et al. | 257/76 |
| 2010/0320505 A1* | 12/2010 | Okamoto et al. | 257/192 |
| 2011/0084284 A1* | 4/2011 | Zhang et al. | 257/77 |
| 2011/0140123 A1* | 6/2011 | Sheppard et al. | 257/76 |
| 2011/0175142 A1* | 7/2011 | Tsurumi et al. | 257/192 |
| 2012/0217512 A1* | 8/2012 | Renaud | 257/76 |

OTHER PUBLICATIONS

F. Medjdoub et al., "Characteristics of Al2O3/AlInN/GaN MOSHEMT", Electronics Letters, Jun. 7, 2007 vol. 43, No. 12.

* cited by examiner

SEMICONDUCTOR DEVICE

CROSS-REFERENCE TO RELATED APPLICATIONS

The disclosure of Japanese Patent Application No. 2011-41277 filed on Feb. 28, 2010 including the specification, drawings and abstract is incorporated herein by reference in its entirety.

BACKGROUND

The present invention relates: to a semiconductor device; in particular to a semiconductor device equipped in a field effect transistor (hereunder abbreviated as "FET") containing a group-III nitride semiconductor as a chief material.

RELATED ART 1

FIG. 14 is a view schematically showing a sectional structure of an FET according to Related Art 1. The FET shown in FIG. 14 is referred to in the description of UMESH K. MISHRA et al., "AlGaN/GaN HEMTs—An Overview of Device Operation and Applications", PROCEEDINGS OF THE IEEE, VOL. 90, NO. 6, June 2002, pp. 1022-1031, for example. As shown in FIG. 14, a buffer layer 81, a channel layer 82, and an electron supply layer 83 are formed in this order over a substrate 80. In the example of FIG. 14, the buffer layer 81 comprises undoped gallium nitride (GaN), the channel layer 82 comprises undoped GaN, and the electron supply layer 83 comprises undoped aluminum gallium nitride $Al_aGa_{1-a}N$. Here, the group-III nitride semiconductor layered structure is formed by Ga plane growth parallel with a [0001] crystallographic axis.

The Al composition ratio a of the electron supply layer ($Al_aGa_{1-a}N$) 83 is set at such a value (0.3 or less for example) as to sufficiently decrease difference from GaN in lattice constant.

A gate electrode 85 is formed on the electron supply layer 83 and a source electrode 841 and a drain electrode 842 are formed opposite the gate electrode 85.

A two dimension electron gas (hereunder abbreviated as "2DEG") layer 86 acting as an electron transit layer is formed in the vicinity of an interface with the electron supply layer 83 in the channel layer 82 and the source electrode 841 and the drain electrode 842 formed over the electron supply layer 83 are in ohmic contact with the 2DEG layer 86.

RELATED ART 2

FIG. 17 is a view schematically showing a sectional structure of an FET according to Related Art 2. The FET shown in FIG. 17 is referred to in the description of F. Medjdoub et al., "Characteristics of Al2O3/AlInN/GaN MOSHEMT", ELECTRONICS LETTERS, 7 Jun. 2007 Vol. 43, No. 12 for example. As shown in FIG. 17, a buffer layer 91 comprising undoped GaN, a channel layer 92 comprising undoped GaN, and an electron supply layer 93 comprising undoped indium aluminum nitride $In_bAl_{1-b}N$ are formed in this order over a substrate 90. Here, the group-III nitride semiconductor layered structure is formed by Ga plane growth parallel with a hexagonal [0001] crystallographic axis.

The In composition ratio b of the electron supply layer ($In_bAl_{1-b}N$) 93 is set at such a value (0.17 to 0.18 for example) as to exhibit lattice matching with GaN.

A gate electrode 95 is formed on the electron supply layer 93 and a source electrode 941 and a drain electrode 942 are formed opposite the gate electrode 95.

A 2DEG layer 96 is formed in the vicinity of an interface with the electron supply layer 93 in the channel layer 92 and the source electrode 941 and the drain electrode 942 formed over the electron supply layer 93 are in ohmic contact with the 2DEG layer 96.

Here, although a spacer layer (AlN spacer) comprising aluminum nitride (AlN) is formed at the interface between an electron supply layer 93 comprising InAlN and a GaN channel layer 92 in F. Medjdoub et al., "Characteristics of Al2O3/AlInN/GaN MOSHEMT", ELECTRONICS LETTERS, 7 Jun. 2007 Vol. 43, No. 12, it is not shown in FIG. 17.

Japanese Unexamined Patent Publication No. 2001-274375 discloses an FET, as a heterojunction FET, having a channel layer comprising $In_xGa_{1-x}N$ (0≤x≤1), an electron supply layer comprising $Al_yGa_{1-y}N$ (0< y≤1), an intermediate layer, and an n-type cap layer comprising GaN, which are formed over a substrate in sequence, wherein a gate electrode is formed on a gate insulation film and a source electrode and a drain electrode are formed respectively on the n-type cap layer; the intermediate layer includes at least a single-layered n-type impurity layer; and thereby polarization negative charge generated between the electron supply layer and the n-type cap layer can be offset by ionization positive charge of the intermediate layer, hence a barrier against electrons decreases, and a source resistance and a drain resistance can decrease.

SUMMARY

Related arts are analyzed hereunder.

FIG. 15 is a graph schematically showing the dependency of an amount of lattice strain on a drain voltage in an electron supply layer ($Al_aGa_{1-a}N$) 83 of an FET according to Related Art 1 shown in FIG. 14. The transverse axis represents a drain voltage and the longitudinal axis represents an amount of strain. FIG. 16 is a graph schematically showing the dependency of a strain energy of a relevant lattice strain on a drain voltage. The transverse axis represents a drain voltage and the longitudinal axis represents a strain energy. Here, FIGS. 15 and 16 are shown for facilitating the comprehension of the following analyses in the present specification and are not disclosed in UMESH K. MISHRA et al., "AlGaN/GaN HEMTs—An Overview of Device Operation and Applications", PROCEEDINGS OF THE IEEE, VOL. 90, NO. 6, JUNE 2002, pp. 1022-1031 and the like.

In an FET of FIG. 14, an electron supply layer ($Al_aGa_{1-a}N$) 83 has an internal strain in a tensile direction in a thermal equilibrium state of zero voltage (drain voltage=0) and hence the internal strain increases nearly in proportion to the drain voltage still in the tensile direction as the drain voltage increases. Consequently, the strain energy monotonically increases with the increase of the drain voltage and, if it exceeds a critical value Ecrit, crystal defects (dislocations) appear. A problem in the structure of FIG. 14 has been that a degradation commencement voltage is for example about 180 V and is relatively low. The principles of such behaviors of a lattice strain and a strain energy are explained hereunder.

In an FET according to Related Art 1, since the lattice constant (A-axis length in crystal axis) of $Al_aGa_{1-a}N$ making up an electron supply layer 83 is smaller than the lattice constant of GaN making up a buffer layer 81, a strain vector ($\in_{1(a)}, \in_{2(a)}, 0$) exists in a tensile direction along a plane as a strain accompanying lattice mismatch in the electron supply layer 83 in a thermal equilibrium state ($\in_{1(a)}>0, \in_{2(a)}>0$).

Further, when a voltage is applied to a drain electrode 842 so that a drain may have a potential more positive than a gate electrode 85, an electric field vector (0, 0, $F_3$) is generated in a direction from a substrate 80 toward the surface in the electron supply layer 83 ($F_3 < 0$). According to the theory of inverse piezoelectric effect, if an electric field $F_3$ is applied to a dielectric substance in the vertical direction (Z direction), a strain deviation ($\Delta\in_{1(a)}$, $\Delta\in_{2(a)}$, 0) (strain caused by the inverse piezoelectric effect) proportional to a relevant electric field strength is generated in the horizontal direction (in an X-Y plane). Here, $\Delta\in_{i(a)}$ (i=1, 2) is represented by the following expression (1).

$$\Delta\in_{i(a)} = d_{i3(a)}F_3 \quad (1)$$

Here, $d_{i3(a)}$ (i=1, 2) is a piezoelectricity component connecting an electric field in the longitudinal direction (vertical direction) $F_3$ to a strain in the horizontal direction $\Delta\in_{i(a)}$ (i=1, 2) in an electron supply layer (AlGaN) 83.

The strain deviation is directed toward a tensile direction when a semiconductor layered structure is Ga plane growth parallel with a [0001] crystallographic axis and an electric field $F_3$ is directed from a substrate 80 toward a surface.

Consequently, a strain vector ($\in_{T1(a)}$, $\in_{T2(a)}$, 0) generated in the electron supply layer (AlGaN) 83 is represented by the following expression (2).

$$\in_{Ti(a)} = \in_{i(a)} + d_{i3(a)}F_3 \quad (2)$$

Since a strain $\in_{i(a)}$ (i=1, 2) accompanying lattice mismatch is directed in the tensile direction and a strain $\Delta\in_{i(a)}$ caused by inverse piezoelectric effect is also directed in the tensile direction, they are reinforced by each other and an internal strain in the electron supply layer (AlGaN) 83 increases.

An amount of strain increases in proportion to the electric field component $F_3$ in the longitudinal direction (vertical direction). Since the electric field $F_3$ is proportional to a drain voltage, the relationship between an amount of strain and a voltage (drain voltage) shown FIG. 15 is obtained.

According to Hooke's law, a strain energy $E_a$ at the time is represented by the following expression (3).

$$E_a = E_{Y(a)}h_a(\in_{1(a)} + d_{13(a)}F_3)^2 \quad (3)$$

In the above expression (3), $E_{Y(a)}$ represents the Young's modulus of the electron supply layer (AlGaN) 83. $h_a$ represents the thickness of the electron supply layer (AlGaN) 83 at a part under a gate electrode 85. Here, it is assumed that the directions along a plane (i=1, 2) are equivalent to each other because of the Ga plane growth.

Since the strain energy $E_a$ increases in proportion to the square of the vertical direction electric field component $F_3$ (the coefficient of the square of $F_3$ is a positive value), the relationship between a strain energy and a voltage shown in FIG. 16 is obtained.

In this way, a problem of an FET according to Related Art 1 has been that an internal strain $\in_{1(a)}$ accompanying lattice mismatch and a strain $\Delta\in_{1(a)}$ caused by inverse piezoelectric effect are reinforced by each other, hence a strain energy rapidly increases undesirably with the increase of a drain voltage, and a degradation commencement voltage lowers.

FIG. 18 is a graph schematically showing the dependency of an amount of lattice strain on a drain voltage in an electron supply layer 93 comprising InAlN in an FET according to Related Art 2 shown in FIG. 17. The transverse axis represents a drain voltage and the longitudinal axis represents an amount of strain. FIG. 19 schematically shows the dependency of a strain energy on a drain voltage. The transverse axis represents a drain voltage and the longitudinal axis represents a strain energy. FIGS. 18 and 19 are shown for facilitating the comprehension of the following analyses in the present specification and are not disclosed in F. Medjdoub et al., "Characteristics of Al2O3/AlInN/GaN MOSHEMT", ELECTRONICS LETTERS, 7 Jun. 2007 Vol. 43, No. 12 and the like.

An electron supply layer (InAlN) 93 in FIG. 17 does not have an internal stress in thermal equilibrium of zero voltage (drain voltage=0). With the increase of a drain voltage however, an internal strain is generated in a tensile direction and the absolute value thereof increases nearly in proportion to voltage.

In an FET according to Related Art 2, an internal strain caused by thermal equilibrium is not generated. As a result, a degradation commencement voltage is 240V for example and thus is improved better than an FET according to Related Art 1 in FIG. 14. That has been insufficient however.

The principles of such behaviors of a lattice strain and a strain energy are explained hereunder.

In an FET according to Related Art 2, since the lattice constant (A-axis length) of $In_bAl_{1-b}N$ making up an electron supply layer 93 in FIG. 17 is nearly equal to GaN making up a buffer layer 91, a strain does not exist in the electron supply layer (InAlN) 93 in a thermal equilibrium state. When a voltage is applied so that a drain electrode 942 may have a potential more positive than a gate, an electric field vector (0, 0, $F_3$) is generated in a direction from a substrate 90 toward a surface in the electron supply layer (InAlN) 93 ($F_3 < 0$). According to the theory of inverse piezoelectric effect, if an electric field $F_3$ is applied to a dielectric substance in the vertical direction, strain deviation ($\Delta\in_{1(b)}$, $\Delta\in_{2(a)}$, 0) proportional to an electric field strength is generated in the horizontal direction. Here, $\Delta\in_{i(b)}$ (i=1, 2) is represented by the following expression (4).

$$\Delta\in_{i(b)} = d_{i3(b)}F_3 \quad (4)$$

Here, $d_{i3(b)}$ (i=1, 2) is a piezoelectricity component connecting an electric field in the longitudinal direction to a strain in the horizontal direction in an electron supply layer (InAlN) 93. The strain deviation is directed toward a tensile direction when a semiconductor layered structure is Ga plane growth parallel with a [0001] crystallographic axis and an electric field $F_3$ is directed from a substrate 90 toward a surface.

Consequently, a strain vector ($\in_{T1(b)}$, $\in_{T2(b)}$, 0) generated in the electron supply layer (InAlN) 93 is represented by the following expression (5).

$$\in_{Ti(b)} = d_{i3(b)}F_3 \quad (5)$$

An amount of strain increases in proportion to the electric field component $F_3$ in the longitudinal direction and hence the relationship between an amount of strain and a voltage shown FIG. 18 is obtained.

According to Hooke's law, a strain energy $E_b$ at the time is represented by the following expression (6).

$$E_b = E_{Y(b)}h_b(d_{13(b)}F_3)^2 \quad (6)$$

Here, $E_{Y(b)}$ represents the Young's modulus of InAlN. $h_b$ represents the thickness of the electron supply layer (InAlN) 93 at a part under a gate electrode 95. Here, it is assumed that the directions along a plane (i=1, 2) are equivalent to each other because of the Ga plane growth.

Since the strain energy increases in proportion to the square of the longitudinal direction electric field component $F_3$, the relationship between a strain energy and a voltage shown in FIG. 19 is obtained.

In this way, a problem of an FET according to Related Art 2 has been that, even though an internal strain accompanying lattice mismatch does not exist, a strain $\Delta\in_{1(b)}$ caused by inverse piezoelectric effect is proportional to an electric field, hence a strain energy monotonically increases undesirably with the increase of a voltage, and a degradation commencement voltage lowers.

As stated above, a problem of an FET according to the related arts has been that, when a high voltage is applied between a gate and a drain, lattice relaxation accompanied by the generation of dislocations (misfit dislocations) is caused easily and device characteristics are likely to deteriorate.

Consequently, the present invention has been invented in view of the above problems in a field effect transistor containing a group-III nitride semiconductor as a chief material and a chief object thereof is to provide a semiconductor device equipped with an FET that makes it possible to inhibit a device from deteriorating and increase reliability even when a high voltage is applied between a gate and a drain.

According to an aspect of the present invention, provided is a semiconductor device equipped with a field effect transistor having a buffer layer subjected to lattice relaxation, a channel layer, and an electron supply layer formed in this order with group-III nitride semiconductors respectively in a growth mode parallel with a [0001] or [000-1] crystallographic axis over a substrate and having a source electrode and a drain electrode, those being coupled electrically to the channel layer, and a gate electrode formed over the electron supply layer, wherein in the buffer layer and the electron supply layer, a layer existing on the group-III atomic plane side of the channel layer has an A-axis length larger than a layer existing on the group-V atomic plane side of the channel layer; and the electron supply layer has a bandgap larger than the channel layer.

According to the aspect of the present invention, in a field effect transistor containing a group-III nitride semiconductor as a chief material, it is possible to inhibit a device from degrading and increase reliability even when a high voltage is applied between a gate and a drain.

DETAILED DESCRIPTION

Figure 1:
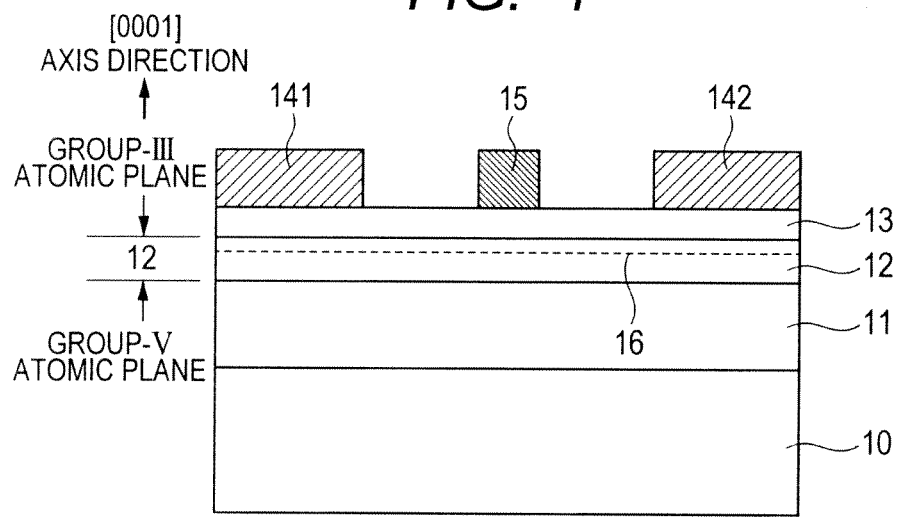
FIG. 1 is a view showing a device structure according to the first embodiment of the present invention.

Preferred forms and embodiments according to the present invention are explained hereunder.

In some preferred forms, in a field effect transistor having a buffer layer subjected to lattice relaxation, a channel layer, and an electron supply layer formed in this order with group-III nitride semiconductors respectively in a growth mode parallel with a [0001] or [000-1] crystallographic axis over a substrate and having a source electrode and a drain electrode, those being coupled electrically to the channel layer, and a gate electrode formed over the electron supply layer: in the buffer layer and the electron supply layer, a layer existing on the group-III atomic plane side of the chamber layer has an A-axis length larger than a layer existing on the group-V atomic plane side of the channel layer; and the electron supply layer has a bandgap larger than the channel layer. "A growth mode parallel with a [0001] or [000-1] crystallographic axis" means a growth mode in which a growth direction is parallel with a [0001] or [000-1] crystallographic axis. In other words, the above field effect transistor is formed on a (0001) or a (000-1) crystal plane.

In some preferred forms: the buffer layer, the channel layer, and the electron supply layer are formed in this order in a group-III atomic plane growth mode parallel with the crystallographic axis over the substrate; and the A-axis length of the electron supply layer existing on the group-III atomic plane side of the channel layer is larger than the A-axis length of the buffer layer existing on the group-V atomic plane side of the channel layer. "A group-III atomic plane growth mode parallel with the [0001] crystallographic axis" means a group-III atomic-plane growth mode in which a growth direction is parallel with a [0001] crystallographic axis. In other words, the buffer layer, the channel layer and the electron supply layer are formed in this order on a (0001) group-III atomic-plane of the substrate.

In some preferred forms, characteristics are that: the buffer layer, the channel layer, and the electron supply layer are formed in this order in a group-V atomic plane growth mode parallel with the [000-1] crystallographic axis over the substrate; and the A-axis length of the electron supply layer existing on the group-V atomic plane side of the channel layer is smaller than the A-axis length of the buffer layer existing on the group-III atomic plane side of the channel layer. "A group-V atomic plane growth mode parallel with the [000-1] crystallographic axis" means a group-V atomic plane growth mode in which a growth direction is parallel with the [000-1] crystallographic axis. In other words, the buffer layer, the channel layer and the electron supply layer are formed in this order on a (000-1) group-V atomic plane of the substrate.

In some preferred forms: the buffer layer comprises GaN; the channel layer comprises GaN; and the electron supply layer comprises $In_xAl_{1-x}N$ (0.18<x<0.53) having a compressive strain.

In some preferred forms: the buffer layer comprises $Al_{z1}Ga_{1-z1}N$ (0<$z_1$≤1); the channel layer comprises GaN; and the electron supply layer comprises $Al_{z2}Ga_{1-z2}N$ (0≤$z_2$<1, $z_2$<$z_1$) having a compressive strain.

In some preferred forms: the buffer layer comprises GaN; the channel layer comprises GaN; and the electron supply layer comprises $In_yAl_{1-y}N$ (0<y<0.17) having a tensile strain.

In some preferred forms: the buffer layer comprises $Al_{u1}Ga_{1-u1}N$ (0≤$u_1$<1); the channel layer comprises GaN; and the electron supply layer comprises $Al_{u2}Ga_{1-u2}N$ (0<$u_2$≤1, $u_1$<$u_2$) having a tensile strain.

In some preferred forms: a top surface of the buffer layer has a (0001) Ga-face crystal plane or a (000-1) N-face crystal plane.

In some preferred forms: The channel layer may be formed on a (0001) Ga-face crystal plane of the buffer layer.

In some preferred forms: The channel layer may be formed on a (000-1) N-face crystal plane of the buffer layer.

In some preferred forms: the device has an insulation film over the electron supply layer; the lower part of the gate electrode is embedded into an opening formed in the insulation film; and the sides of the upper part thereof opposing the source electrode and the drain electrode protrude respectively toward the source electrode side and the drain electrode side and cover the insulation film (field plate structure).

In such a field effect transistor, since an internal strain at thermal equilibrium accompanying lattice mismatch and a strain deviation accompanying inverse piezoelectric effect offset each other, a strain energy during the application of a drain voltage is inhibited. By the present invention therefore, it is possible to improve a degradation commencement voltage in comparison with field effect transistors according to Related Arts. As a result, it is possible to inhibit device degradation from occurring and improve reliability even when a high voltage is applied between a gate and a drain. Exemplary embodiments are explained hereunder in reference to drawings.

First Embodiment

FIG. 1 is a view schematically showing the sectional structure of a semiconductor device according to the exemplary first embodiment of the present invention. In FIG. 1, the numeral 10 represents a substrate, 11 a buffer layer subjected to lattice relaxation, 12 a channel layer, and 13 an electron supply layer. The semiconductor layered structure is formed by group-III atomic plane growth in which the growth direction is parallel with a [0001] crystallographic axis, the bandgap of the electron supply layer 13 is larger than that of the channel layer 12, and the A-axis length of the electron supply layer 13 is larger than that of the buffer layer 11. That is, a compressive strain is generated at thermal equilibrium of zero voltage in the electron supply layer 13.

Here, in the buffer layer 11 and the electron supply layer 13, a layer existing on the group-III atomic plane side of the channel layer 12 is the electron supply layer 13 and a layer existing on the group-V atomic plane side of the channel layer 12 is the buffer layer 11. Then, the A-axis length of the layer on the group-III atomic plane side (electron supply layer 13) is larger than that of the layer on the group-V atomic plane side (buffer layer 11).

A 2DEG layer 16 is formed in the channel layer 12 and a source electrode 141 and a drain electrode 142, those being coupled electrically to the 2DEG layer 16, are formed in an opposing manner. A gate electrode 15 is formed over a part of the electron supply layer 13 interposed between the source electrode 141 and the drain electrode 142. The channel layer 12 may be formed on a (0001) Ga-face crystal plane of the buffer layer or a (000-1) N-face crystal plane of the buffer layer.

Figure 2:
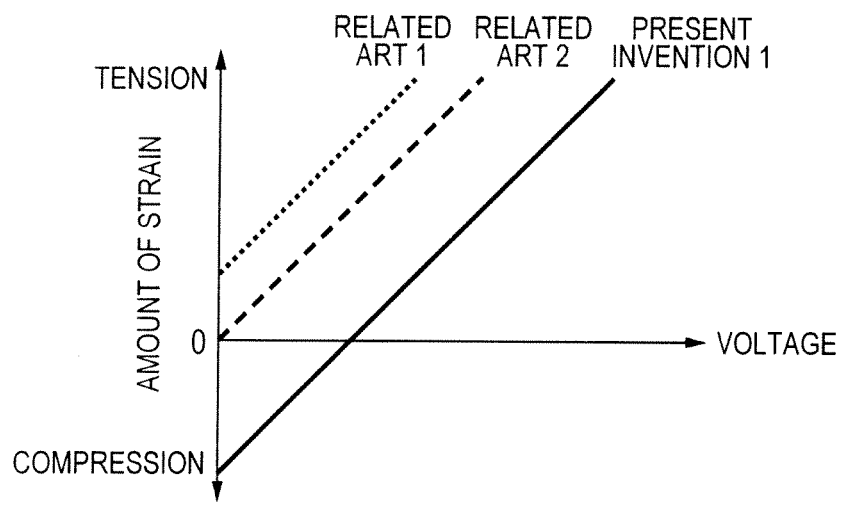
FIG. 2 is a graph schematically showing the dependency of an internal strain on a voltage according to the first embodiment of the present invention.
Figure 3:
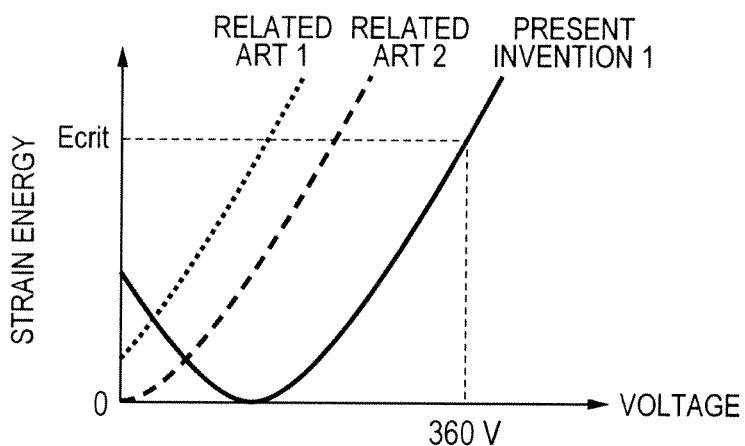
FIG. 3 is a graph schematically showing the dependency of a strain energy on a voltage according to the first embodiment of the present invention.

FIG. 2 is a graph schematically showing the dependency of an amount of lattice strain on a drain voltage in the electron supply layer 13 of an FET shown in FIG. 1. FIG. 3 is a graph schematically showing the dependency of a strain energy on a drain voltage. The characteristics of FETs according to Related Arts 1 and 2 are also shown in FIGS. 2 and 3. An electron supply layer 13 has an internal strain in the compressive direction at thermal equilibrium of zero drain voltage and the internal strain turns from compressive to tensile with the increase of a drain voltage.

Consequently as shown in FIG. 3, the strain energy once reduces and then turns to increase as the drain voltage increases from zero. As a result, a degradation commencement voltage is about 360 V for example and improves considerably in comparison with 180 V and 240 V of Related Arts 1 and 2.

The principles of such behaviors of a lattice strain and a strain energy in the present embodiment are explained hereunder.

In the present embodiment, since the lattice constant (A-axis length) of an electron supply layer 13 is larger than that of a buffer layer 11, a strain vector (−∈$_{1(x)}$, −∈$_{2(x)}$, 0) in a compressive direction along a plane exists in the electron supply layer 13 in a thermal equilibrium state (here, ∈$_{1(x)}$>0, ∈$_{2(x)}$>0).

When a drain voltage is applied to a gate so that a drain may have a positive electric potential, an electric field vector (0, 0, $F_3$) is generated in the direction from a substrate 10 toward a surface in the electron supply layer 13 ($F_3$< 0). According to the theory of inverse piezoelectric effect, if a vertical direction electric field $F_3$ is applied to a dielectric substance, a strain deviation in the horizontal direction (Δ∈$_{1(x)}$, Δ∈$_{2(x)}$, 0) proportional to an electric field strength is generated. Δ∈$_{i(x)}$ (i=1, 2) is represented by the following expression (7).

$$\Delta\in_{i(x)} = d_{i3(x)} F_3 \quad (7)$$

Here, $d_{i3(x)}$ (i=1, 2) is a piezoelectricity component connecting a vertical direction electric field component $F_3$ to a horizontal direction strain Δ∈$_{i(x)}$ in a material making up the electron supply layer 13.

The strain deviation is directed toward the tensile direction when a semiconductor layered structure is group-III atomic plane growth in which the growth direction is parallel with a [0001] crystallographic axis and an electric field $F_3$ is directed from a substrate 10 toward a surface.

Consequently, a strain vector (∈$_{T1(x)}$, ∈$_{T2(x)}$, 0) generated in the electron supply layer 13 is represented by the following expression (8).

$$\in_{Ti(x)} = -\in_{i(x)} + d_{i3(x)} F_3 \quad (8)$$

Since a strain ∈$_{i(x)}$ (i=1, 2) accompanying lattice mismatch is directed in the compressive direction and a strain Δ∈$_{i(x)}$ $(=d_{i3(x)}F_3)$ (i=1, 2) caused by inverse piezoelectric effect is directed in the tensile direction in the expression (8), they offset each other and an internal strain ($\in_{T(x)}$) in the electron supply layer 13 decreases.

From the expression (8), an amount of strain increases in proportion to a vertical direction electric field component $F_3$. Since the longitudinal direction electric field component $F_3$ is proportional to a drain voltage, the relationship between an amount of strain (lattice strain) and a voltage (drain voltage) shown FIG. 2 is obtained.

According to Hooke's law, a strain energy $E_x$ at the time is represented by the following expression (9).

$$E_x = E_{Y(x)} h_x (-\in_{1(x)} + d_{13(x)} F_3)^2 \quad (9)$$

In the above expression (9), $E_{Y(x)}$ represents the Young's modulus of the material making up the electron supply layer 13. $h_x$ represents the thickness of the electron supply layer 13 at a part under a gate electrode 15. Here, it is assumed that the directions along a plane (i=1, 2) are equivalent to each other because of the group-III atomic plane growth.

From the above expression (9), the strain energy $E_x$ increases in proportion to the square of the vertical direction electric field component $F_3$ (the coefficient of the square of $F_3$ is a positive value). Consequently, the relationship between a strain energy and a voltage (drain voltage) shown in FIG. 3 is obtained.

In this way, in the present embodiment, since the internal strain $-\in_{1(x)}$ accompanying lattice mismatch and the strain $\Delta\in_{1(x)}$ caused by inverse piezoelectric effect offset each other, the internal strain in the electron supply layer 13 is compressive at thermal equilibrium and turns from compressive to tensile with the increase of a voltage (drain voltage).

Consequently, the strain energy once decreases and then turns to increase with the increase of a voltage, and the degradation commencement voltage that is a drain voltage when the strain energy reaches a critical value Ecrit is 360 V in the example shown in FIG. 3 and improves considerably in comparison with the degradation commencement voltages of 180 V and 240 V in the cases of Related Arts 1 and 2.

Then, since the bandgap of the electron supply layer 13 is larger than that of the channel layer 12, the 2DEG layer 16 is accumulated in the interior of the channel layer 12, electrons travel in the channel layer 12 of a high electron mobility, and hence high-speed motion can be realized.

A concrete crystal structure for realizing such a structure is explained hereunder.

Figure 4:
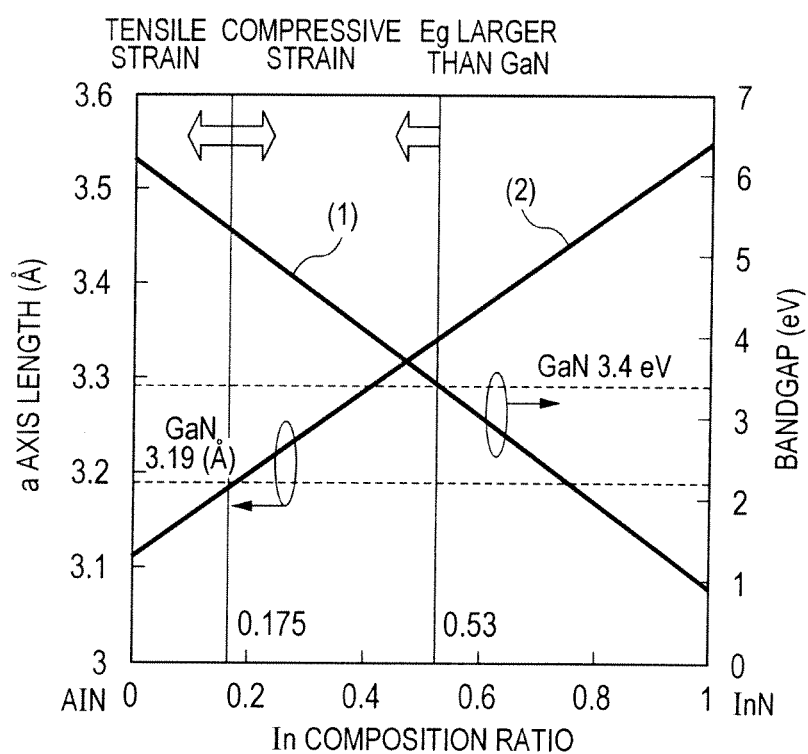
FIG. 4 is a graph showing the dependency of an A-axis length and a bandgap of InAlN on an In composition ratio.

FIG. 4 shows the dependency of an A-axis length (longitudinal axis: unit=angstrom=$10^{-10}$ m=0.1 nanometer) on an In composition ratio (transverse axis) (Characteristic 2) and the dependency of a bandgap (longitudinal axis: unit=eV (electron volt)) on an In composition ratio (Characteristic 1) of $In_xAl_{1-x}N$. From the dependencies on an In composition ratio (Characteristics 1 and 2) shown in FIG. 4, it is understood that, by setting an In composition ratio x in the range of 0.18<x<0.53, it is possible to make the A-axis length of $In_xAl_{1-x}N$ larger than the A-axis length of GaN (=3.19 angstroms) and the bandgap of $In_xAl_{1-x}N$ larger than the bandgap of GaN (=3.4 eV).

Consequently, in such a device structure as shown in FIG. 1, by forming a buffer layer 11 with GaN, a channel layer 12 with GaN, and an electron supply layer 13 with $In_xAl_{1-x}N$ (In composition ratio x: 0.18<x<0.53) for example, the A-axis length of the electron supply layer 13 is larger than that of the buffer layer 11 and the bandgap of the electron supply layer 13 is larger than that of the channel layer 12.

Figure 5:
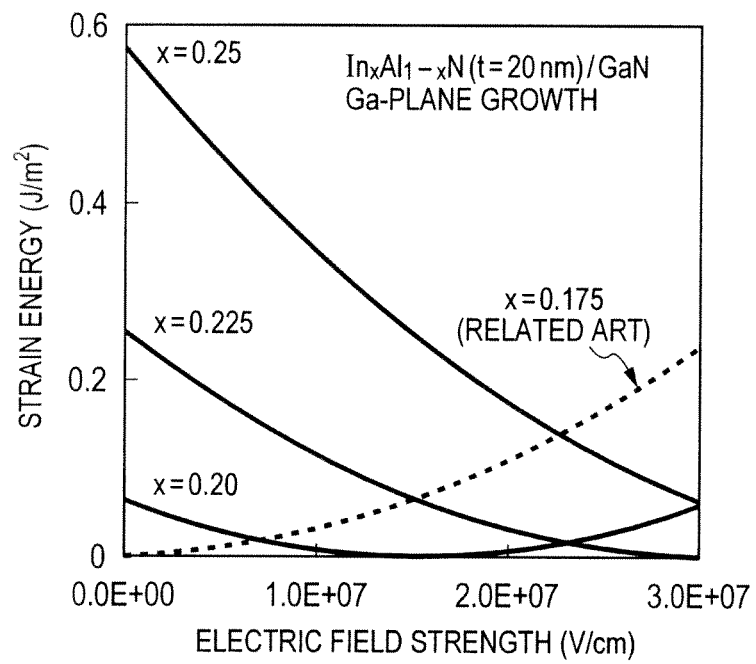
FIG. 5 is a graph showing the computation result of the dependency of a strain energy on an electric field strength according to the first embodiment of the present invention.

FIG. 5 is a graph showing the computation result of the dependency of a strain energy (longitudinal axis: J/m²) on a vertical direction electric field strength (transverse axis: V/cm) when the In composition ratio x of an electron supply layer 13 comprising $In_xAl_{1-x}N$ is varied in an FET according to the present embodiment shown in FIG. 1. In FIG. 5, the dotted line (x=0.175) shows the dependency of a strain energy on an In composition ratio when an electron supply layer 13 comprising InAlN lattice-matches with a buffer layer 11 comprising GaN and that corresponds to an FET according to Related Art 2 (comparative example). The characteristics in the cases where the In composition ratio x is 0.20, 0.225, and 0.25 take the forms of quadratic functions.

As a result of analyses, it is found that a tentative effect of offsetting a strain energy can be obtained when the In composition ratio x of an electron supply layer 13 comprising $In_xAl_{1-x}N$ is in the range of 0.18<x<0.53.

In the case of an In composition ratio x>0.25 however, lattice mismatch increases and undesirably a strain energy increases excessively at thermal equilibrium of an electric field strength=0 as shown in FIG. 5. Consequently, it is desirable to set an In composition ratio x in the range of 0.19<x<0.25.

As a result of further analyses, it is found that the strain energy in the interior of an FET can be minimized when an In composition ratio x is set at about 0.2 as shown in FIG. 5. In the case of an In composition ratio x=0.20, the characteristic takes the form of a quadratic function showing a minimum strain energy (=0) at an electric field strength of about $1.5 \times 10^7$ V/cm.

In a practical application, it is possible to sufficiently obtain the functions and effects of the present invention by setting an In composition ratio x in the range of 0.19<x<0.21 for example.

A manufacturing method of an FET according to the above embodiment is explained hereunder in reference to FIG. 1 (here, the In composition ratio x is set at 0.2).

A nucleation layer 200 nm in thickness (not shown in the figure) comprising a superlattice formed by stacking undoped AlN and undoped GaN alternately, a buffer layer 11 (layer thickness: 1 μm) comprising undoped GaN, a channel layer 12 (layer thickness: 50 nm) comprising undoped GaN, and an electron supply layer 13 (layer thickness: 20 nm) comprising undoped $In_{0.2}Al_{0.8}N$ are grown in this order over a (111) plane silicon (Si) substrate 10 for example by a metal organic chemical vapor deposition (abbreviated as MOCVD) method. Here, the semiconductor layered structure is formed by Ga plane growth in which the growth direction is parallel with a [0001] crystallographic axis. The channel layer is grown on a (0001) Ga-face crystal plane of the buffer layer. The thickness of the electron supply layer (InAlN) 13 is set so as to be thinner than a critical film thickness of generating dislocations over the buffer layer (GaN) 11. By so doing, it is possible to obtain a good crystal quality of inhibiting dislocations from being generated.

On the basis of spontaneous polarization effect and piezoelectric polarization effect, positive electric charge having an area density of about $3 \times 10^{13}$ cm$^{-2}$ is generated at the interface between an electron supply layer 13 comprising InAlN and a channel layer 12 comprising GaN. Consequently, whereas both the electron supply layer 13 and the channel layer 12 are undoped, a 2DEG layer 16 is formed in the channel 12 comprising GaN.

A source electrode 141 and a drain electrode 142 are formed respectively over the electron supply layer 13 for example by evaporating and alloying a metal such as titanium (Ti)/aluminum (Al)/nickel (Ni)/gold (Au) and are in ohmic contact with the 2DEG layer 16.

Successively, device isolation is applied by ion implantation of nitrogen (N) or the like.

A gate electrode 15 is formed over the electron supply layer 13 comprising InAlN in the region interposed between the source electrode 141 and the drain electrode 142 by evaporating and lifting off a metal such as Ni/Au. Such an FET as shown in FIG. 1 is manufactured in this way.

Second Embodiment

Figure 6:
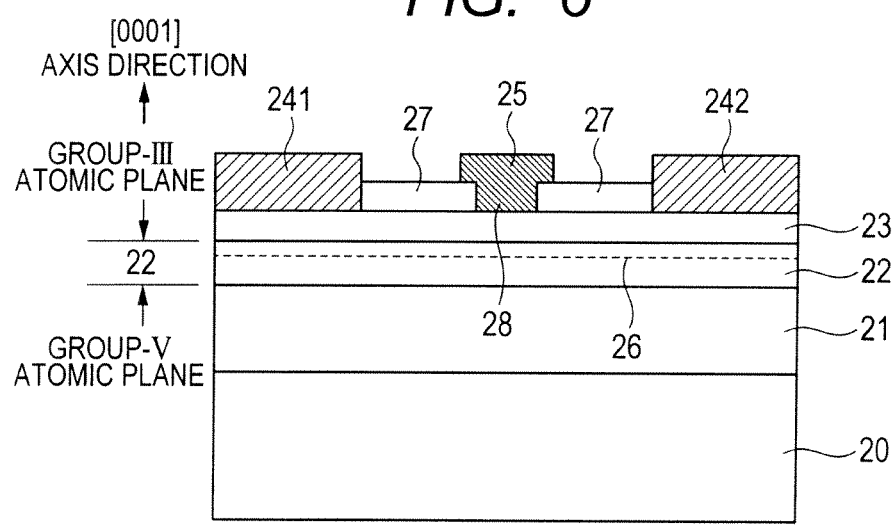
FIG. 6 is a view showing a device structure according to the second embodiment of the present invention.

FIG. 6 is a view schematically showing the sectional structure of an FET according to the second embodiment of the present invention. In FIG. 6, the numeral 20 represents a substrate, 21 a buffer layer comprising $Al_{z1}Ga_{1-z1}N$ subjected to lattice relaxation, 22 a channel layer comprising GaN, and 23 an electron supply layer comprising $Al_{z2}Ga_{1-z2}N$. Here, $z_1$ and $z_2$ have the relation of $0 \leq z_2 < z_1 \leq 1$. The semiconductor layered structure is formed by Ga plane growth in which a growth direction is parallel with a [0001] crystallographic axis, the bandgap of the electron supply layer 23 is larger than that of the channel layer 22, and the A-axis length of the electron supply layer 23 is larger than that of the buffer layer 21. A compressive strain is generated at thermal equilibrium in the electron supply layer 23.

A 2DEG layer 26 is formed in the channel layer 22 and a source electrode 241 and a drain electrode 242, those being coupled electrically to the 2DEG layer 26, are formed in an opposing manner.

An insulation film 27 is formed over the electron supply layer 23 and a gate electrode 25 is formed in the manner of being embedded into an opening 28 formed in the insulation film 27. The gate electrode 25 is formed so as to cover the insulation film 27 at the source side end part and the drain side end part thereof and has a shape of eaves. The eave-shaped parts function as a field plate structure to alleviate so-called electric field concentration.

A semiconductor layered structure according to the present embodiment has a strain layer formed by a Ga plane growth with a growth direction of a [0001] crystallographic axis wherein the bandgap of the electron supply layer 23 is larger than that of the channel layer 22, and the A-axis length of the electron supply layer 23 is larger than that of the buffer layer 21. Consequently, on the basis of the principle similar to the first embodiment, the internal strain of the electron supply layer 23 at thermal equilibrium and the strain deviation accompanying inverse piezoelectric effect offset each other (refer to the expression (8)) and hence a strain energy when a drain voltage is applied is inhibited.

In the present embodiment further, electric field concentration generated at the drain side end of the gate is alleviated by the effect of a field plate. Consequently, a vertical direction electric field $F_3$ decreases and a strain energy caused by inverse piezoelectric effect is further inhibited from increasing in accordance with the expression (9).

Figure 7:
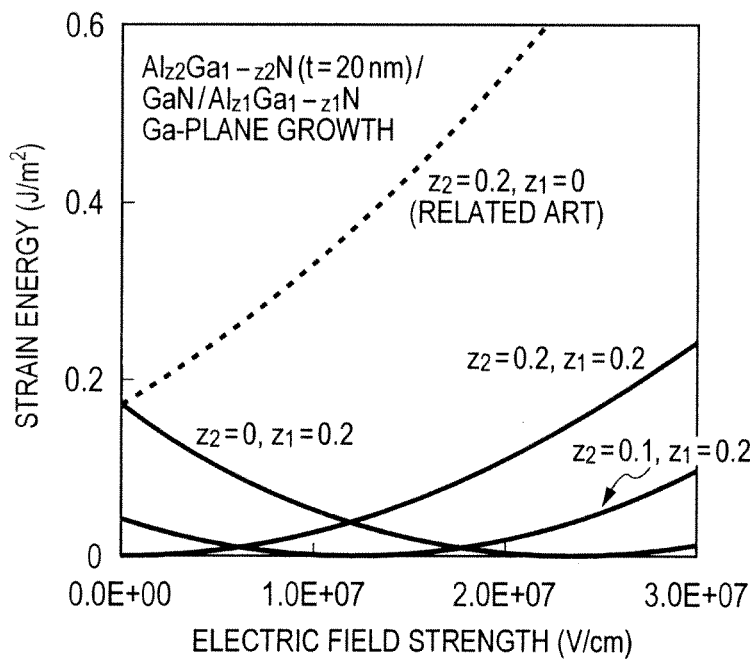
FIG. 7 is a graph showing the computation result of the dependency of a strain energy on an electric field strength according to the second embodiment of the present invention.

FIG. 7 is a graph showing the computation result of the dependency of a strain energy on a vertical direction electric field strength when the Al composition ratio $z_2$ of an electron supply layer ($Al_{z2}Ga_{1-z2}N$) 23 is varied in an FET structure shown in FIG. 6. The Al composition ratio $z_1$ of a buffer layer ($Al_{z1}Ga_{1-z1}N$) 21 is fixed to 0.2. In FIG. 7, the dotted line ($Z_2=0.2$, $Z_1=0$) shows the dependency of a strain energy on a vertical direction electric field strength corresponding to an FET according to Related Art 1.

As a result of analyses, it is found that a tentative effect of offsetting a strain energy can be obtained if the expression $z_2 < z_1$ is satisfied.

As a result of further analyses, it is found that it is possible to minimize the strain energy in the interior of an FET when the value $z_1$-$z_2$ is set at about 0.1 as the result of $z_2=0.1$, $z_1=0.2$ shows in FIG. 7. In a practical application, when the expression $0.05 < z_1$-$z_2 < 0.15$ is satisfied, intended functions and effects can be obtained sufficiently.

A manufacturing method of an FET according to the second embodiment of the present invention is explained hereunder (the case of $z_2=0.1$, $z_1=0.2$).

A nucleation layer 200 nm in thickness (not shown in the figure) comprising a superlattice formed by stacking undoped AlN and undoped GaN alternately, a buffer layer 21 (layer thickness: 1 μm) comprising undoped $Al_{0.2}Ga_{0.8}N$, a channel layer 22 (layer thickness: 50 nm) comprising undoped GaN, and an electron supply layer 23 (layer thickness: 20 nm) comprising n-type $Al_{0.1}Ga_{0.9}N$ are grown in this order over a (111) plane Si substrate 20 for example by an MOCVD method. Here, the semiconductor layered structure is formed by Ga plane growth in which a growth direction is parallel with a [0001] crystallographic axis. The channel layer 22 is grown on a (0001) Ga-face crystal plane. The thicknesses of the channel layer (GaN) 22 and the electron supply layer (AlGaN) 23 are set so as to be thinner than a critical film thickness of generating dislocations over the buffer layer (AlGaN) 21. By so doing, it is possible to obtain a good crystal quality of inhibiting dislocations from being generated.

Si for example is used as an n-type impurity added to the electron supply layer (AlGaN) 23 and the concentration of the impurity is set at about $5 \times 10^{18}$ cm$^{-3}$ for example.

On the basis of spontaneous polarization effect and piezoelectric polarization effect, negative electric charge having an area density of about $1 \times 10^{13}$ cm$^{-2}$ is generated at the interface between a buffer layer (AlGaN) 21 and a channel layer (GaN) 22. Further, positive electric charge having an area density of about $5 \times 10^{12}$ cm$^{-2}$ is generated at the interface between an electron supply layer (AlGaN) 23 and a channel layer (GaN) 22.

Since an n-type impurity of a high concentration is added to the electron supply layer (AlGaN) 23 however, a 2DEG layer 26 is formed in the channel layer (GaN) 22.

A source electrode 241 and a drain electrode 242 are formed respectively over the electron supply layer 23 for example by evaporating and alloying a metal such as Ti/Al/Ni/Au and are in ohmic contact with the 2DEG layer 26.

Successively, device isolation is applied by ion implantation of N or the like. Subsequently, an insulation film 27 (film thickness: 60 nm) comprising silicon nitride ($Si_3N_4$) is formed for example by a plasma-enhanced chemical vapor deposition (abbreviated as "PECVD") method.

After an opening pattern is formed by an ordinary photolithography method, an opening 28 is formed by removing the insulation film 27 and exposing the electron supply layer 23 for example by a dry etching method with a reactive gas such as sulfur fluoride ($SF_6$).

Successively, a gate electrode 25 is formed in the manner of being embedded into the opening 28 for example by evaporating and lifting off a metal such as Ni/Au. Such an FET as shown in FIG. 6 is manufactured in this way.

Third Embodiment

Figure 8:
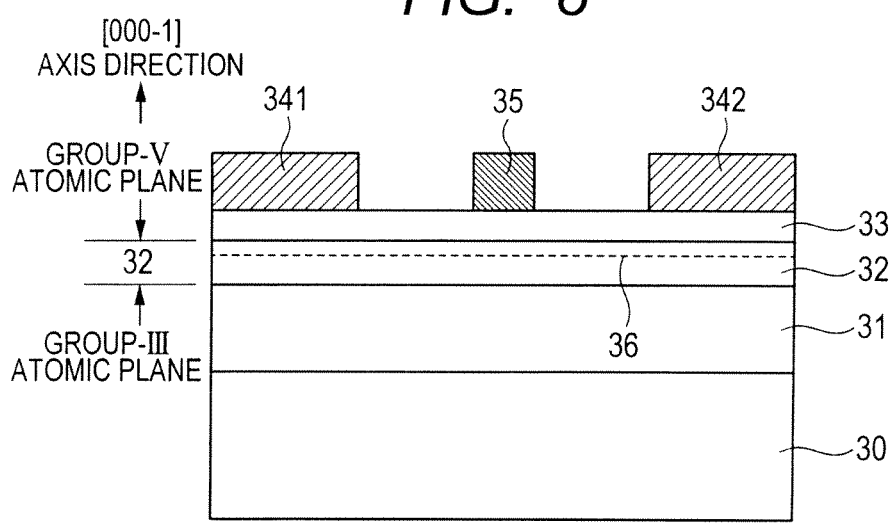
FIG. 8 is a view showing a device structure according to the third embodiment of the present invention.

FIG. 8 is a view schematically showing a sectional structure according to the third embodiment of the present invention. In FIG. 8, the numeral 30 represents a substrate, 31 a buffer layer subjected to lattice relaxation, 32 a channel layer, and 33 an electron supply layer. Here, the semiconductor layered structure is formed by group-V atomic plane growth in which a growth direction is parallel with a [000-1] crystallographic axis, the bandgap of the electron supply layer 33 is larger than that of the channel layer 32, and the A-axis length of the electron supply layer 33 is smaller than that of the buffer layer 31. That is, a tensile strain is generated at thermal equilibrium in the electron supply layer 33.

Here, in the buffer layer 31 and the electron supply layer 33, a layer existing on the group-III atomic plane side of the channel layer 32 is the buffer layer 31 and a layer existing on the group-V atomic plane side of the channel layer 32 is the electron supply layer 33, and the A-axis length of the layer on the group-III atomic plane side (buffer layer 31) is larger than the A-axis length of the layer on the group-V atomic plane side (electron supply layer 33).

A 2DEG layer 36 is formed in the channel layer 32 and a source electrode 341 and a drain electrode 342, those being coupled electrically to the 2DEG layer 36, are formed in an opposing manner.

A gate electrode 35 is formed over a part of the electron supply layer 33 interposed between the source electrode 341 and the drain electrode 342.

Figure 9:
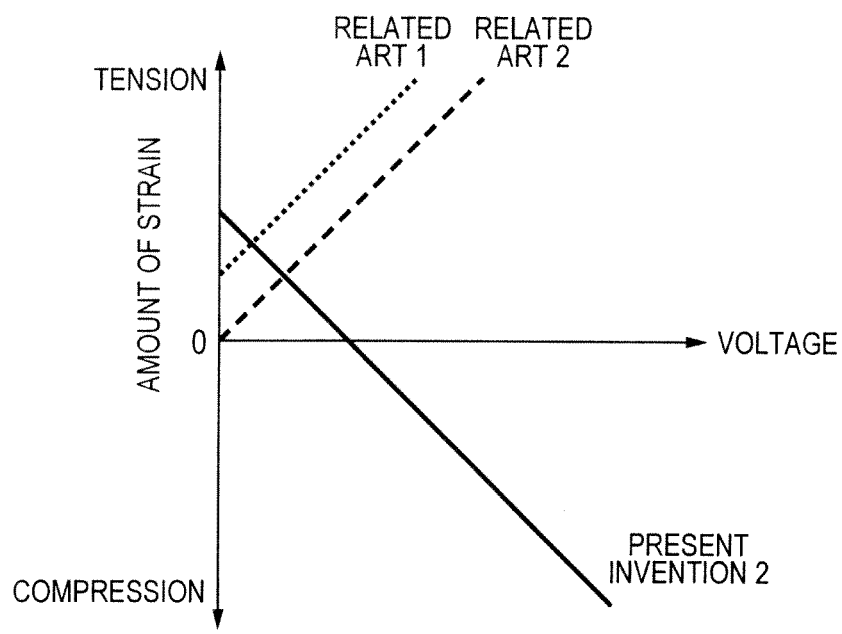
FIG. 9 is a graph schematically showing the dependency of an internal strain on a voltage according to the third embodiment of the present invention.
Figure 10:
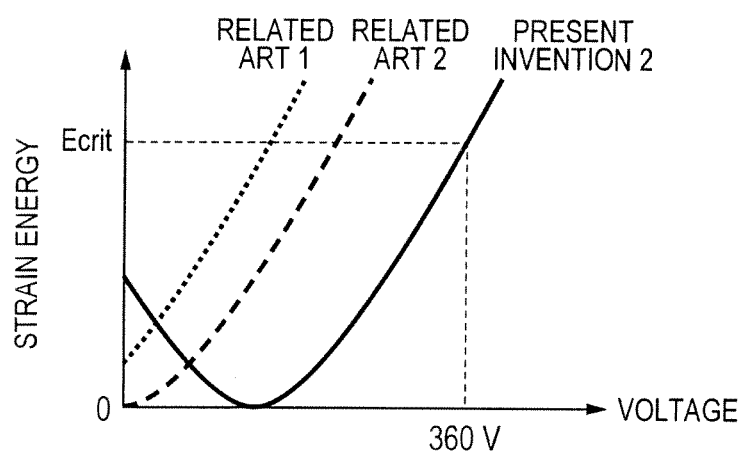
FIG. 10 is a graph schematically showing the dependency of a strain energy on a voltage according to the third embodiment of the present invention.

FIG. 9 is a graph schematically showing the dependency of an amount of lattice strain on a drain voltage in the electron supply layer 33 of an FET shown in FIG. 8. FIG. 10 is a graph schematically showing the dependency of a strain energy on a drain voltage. The characteristics of FETs according to Related Arts 1 and 2 are also shown in FIGS. 9 and 10 as comparative examples.

The electron supply layer 33 has an internal strain in the tensile direction at thermal equilibrium of zero voltage (drain voltage=0) and the internal strain turns from tensile to compressive in proportion to the increase in the drain voltage and the strain energy once reduces and then turns to increase with the increase in the voltage. As a result, a degradation commencement voltage is about 360 V for example and improves considerably in comparison with 180 V and 240 V of Related Arts 1 and 2.

The principles of such behaviors of a lattice strain and a strain energy in the present embodiment are explained hereunder.

In the present embodiment, since the lattice constant (A-axis length) of an electron supply layer 33 is smaller than the lattice constant (A-axis length) of a buffer layer 31, a strain vector ($\in_{1(y)}, \in_{2(y)}, 0$) in a tensile direction exists along a plane in the electron supply layer 33 in a thermal equilibrium state ($\in_{1(y)} > 0, \in_{2(y)} > 0$).

When a voltage is applied to a gate so that a drain may have a positive electric potential, an electric field vector (0, 0, $F_3$) is generated in the direction from a substrate 30 toward a surface in the electron supply layer 33 ($F_3 < 0$). According to the theory of inverse piezoelectric effect, if a vertical direction electric field $F_3$ is applied to a dielectric substance, strain deviation ($\Delta\in_{1(y)}, \Delta\in_{2(y)}, 0$) proportional to an electric field strength is generated in the horizontal direction. Here, $\Delta\in_{i(y)}$ (i=1, 2) is represented by the following expression (10).

$$\Delta\in_{i(y)} = -d_{i3(y)} F_3 \qquad (10)$$

In the expression (10), $d_{i3(y)}$ (i=1, 2) is a piezoelectricity component connecting a vertical direction electric field component $F_3$ to a horizontal direction strain $\Delta\in_{i(y)}$ in a material making up the electron supply layer 33.

The strain deviation is directed toward the compressive direction when a semiconductor layered structure is group-V atomic plane growth in which a growth direction is parallel with a [000-1] crystallographic axis and an electric field is directed from a substrate toward a surface.

Consequently, a strain vector ($\in_{T1(y)}, \in_{T2(y)}, 0$) generated in the electron supply layer 33 is represented by the following expression (11).

$$\in_{Ti(y)} = \in_{i(y)} - d_{i3(y)} F_3 \qquad (11)$$

Since a strain $\in_{i(y)}$ accompanying lattice mismatch is directed in the tensile direction and a strain $\Delta\in_{i(y)}$ caused by inverse piezoelectric effect is directed in the compressive direction, they offset each other and an internal strain in the electron supply layer 33 decreases.

Since an amount of strain increases in proportion to the vertical direction electric field component $F_3$, the relationship between a lattice strain and a voltage shown FIG. 9 is obtained.

According to Hooke's law, a strain energy $E_y$ at the time is represented by the following expression (12).

$$E_y = E_{Y(y)} h_y (\in_{1(y)} + d_{13(y)} F_3)^2 \qquad (12)$$

In the above expression (12), $E_{Y(y)}$ represents the Young's modulus of the material making up the electron supply layer 33. $h_y$ represents the thickness of the electron supply layer 33 at a part under a gate electrode 35. Here, it is assumed that the directions along a plane (i=1, 2) are equivalent to each other because of the group-V atomic plane growth.

Since the strain energy $E_y$ increases in proportion to the square of the vertical direction electric field component $F_3$ (the coefficient of the square of $F_3$ is a positive value), the relationship between a strain energy and a voltage shown in FIG. 10 is obtained.

In this way, in the present embodiment, since the internal strain $\in_{1(y)}$ accompanying lattice mismatch and the strain $\Delta\in_{1(y)}$ caused by inverse piezoelectric effect offset each other, the internal strain is tensile at thermal equilibrium and turns from tensile to compressive with the increase of a voltage. Consequently, the strain energy $E_y$ once decreases and then turns to increase with the increase of a voltage (drain), and the degradation commencement voltage (drain voltage when the strain energy equals Ecrit: 360 V) improves considerably in comparison with Related Arts 1 and 2.

Then, since the bandgap of the electron supply layer 33 is larger than that of the channel layer 32, the 2DEG layer 36 is formed in the interior of the channel layer 32, electrons travel in the channel layer 32 of a high electron mobility, and hence high-speed motion can be realized.

A concrete crystal structure for realizing a structure according to the third embodiment is explained hereunder.

From FIG. 4, by setting an In composition ratio y in the range of 0<y<0.17, the A-axis length of $In_yAl_{1-y}N$ is smaller than that of GaN and the bandgap of $In_yAl_{1-y}N$ is larger than that of GaN.

Consequently, in such a device structure as shown in FIG. 8, by forming a buffer layer 31 with GaN, a channel layer 32 with GaN, and an electron supply layer 33 with $In_yAl_{1-y}N$ (0<y<0.17) for example, the A-axis length of the electron supply layer 33 is smaller than that of the buffer layer 31 and the bandgap of the electron supply layer 33 is larger than that of the channel layer 32.

Figure 11:
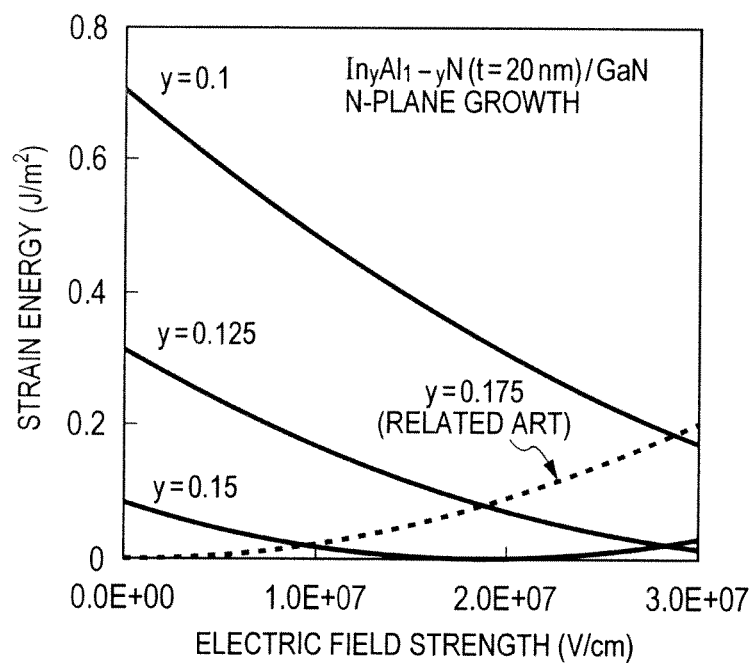
FIG. 11 is a graph showing the computation result of the dependency of a strain energy on an electric field strength according to the third embodiment of the present invention.

FIG. 11 is a graph showing the computation result of the dependency of a strain energy on a vertical direction electric field strength when the In composition ratio y of an electron supply layer 33 comprising $In_yAl_{1-y}N$ is varied in an FET structure shown in FIG. 8. In FIG. 11, the dotted line (x=0.175) shows the case where an InAlN electron supply layer 33 lattice-matches a GaN buffer layer 31 and corresponds to an FET according to Related Art 2.

As a result of analyses, it is found that a tentative effect of offsetting a strain energy can be obtained when the In composition ratio y of an electron supply layer 33 comprising In$_y$Al$_{1-y}$N is in the range of 0<y<0.17.

In the case of y<0.1, however, lattice mismatch increases and undesirably a strain energy increases excessively at thermal equilibrium. Consequently, it is desirable to set y in the range of 0.1<y<0.16.

As a result of further analyses, it is found that the strain energy in the interior of an FET can be minimized when y is set at about 0.15 as shown in FIG. 11. In a practical application, it is possible to sufficiently obtain intended effects by setting y in the range of 0.14<y<0.16.

A manufacturing method of an FET according to the third embodiment is explained (the case of y=0.15).

A nucleation layer 200 nm in thickness (not shown in the figure) comprising a superlattice formed by stacking undoped AlN and undoped GaN alternately, a buffer layer 31 (layer thickness: 1 μm) comprising undoped GaN, a channel layer 32 (layer thickness: 50 nm) comprising undoped GaN, and an electron supply layer 33 (layer thickness: 20 nm) comprising n-type In$_{0.15}$Al$_{0.85}$N are grown in this order over a (111) plane Si substrate 30 for example by an MOCVD method. Here, the semiconductor layered structure is formed by N plane growth in which a growth direction is parallel with a [000-1] crystallographic axis. The channel layer 32 is grown on a (000-1) N-face crystal plane of the buffer layer 31.

The thickness of the electron supply layer 33 comprising In$_{0.15}$Al$_{0.85}$N is set so as to be thinner than a critical film thickness of generating dislocations over the buffer layer 31 comprising GaN. By so doing, it is possible to obtain a good crystal quality of inhibiting dislocations from being generated.

Si for example is used as an n-type impurity added to the electron supply layer 33 comprising In$_{0.15}$Al$_{0.85}$N and the concentration of the impurity is set at about 5×10$^{19}$ cm$^{-3}$ for example.

On the basis of spontaneous polarization effect and piezoelectric polarization effect, negative electric charge having an area density of about 3×10$^{13}$ cm$^{-2}$ is generated at the interface between an electron supply layer (In$_{0.15}$Al$_{0.85}$N) 33 and a channel layer (GaN) 32. Since an n-type impurity of a high concentration is added to the electron supply layer 33 however, a 2DEG layer 36 is formed in the channel layer (GaN) 32.

A source electrode 341 and a drain electrode 342 are formed respectively over the electron supply layer 33 for example by evaporating and alloying a metal such as Ti/Al/Ni/Au and are in ohmic contact with the 2DEG layer 36.

Successively, device isolation is applied by ion implantation of N or the like. A gate electrode 35 is formed over a part of the electron supply layer 33 interposed between the source electrode 341 and the drain electrode 342 by evaporating and lifting off a metal such as Ni/Au. Such an FET as shown in FIG. 8 is manufactured in this way.

Fourth Embodiment

Figure 12:
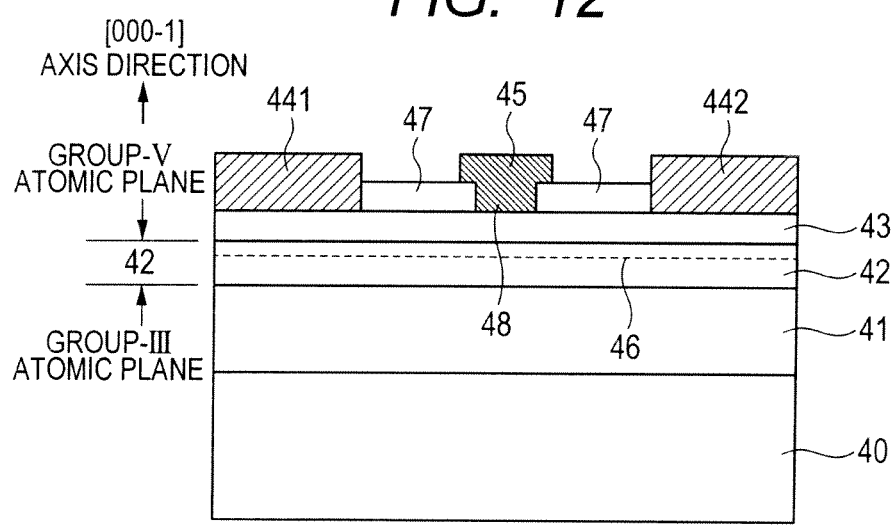
FIG. 12 is a view showing a device structure according to the fourth embodiment of the present invention.

FIG. 12 is a view schematically showing the sectional structure according to the fourth embodiment of the present invention. In FIG. 12, the numeral 40 represents a substrate, 41 a buffer layer comprising Al$_{u1}$Ga$_{1-u1}$N subjected to lattice relaxation, 42 a channel layer comprising GaN, and 43 an electron supply layer comprising Al$_{u2}$Ga$_{1-u2}$N. Here, u$_1$ and u$_2$ have the relation of 0≤u$_1$<u$_2$≤1. The semiconductor layered structure is formed by N plane growth in which a growth direction is parallel with a [000-1] crystallographic axis, the bandgap of the electron supply layer 43 is larger than that of the channel layer 42, and the A-axis length of the electron supply layer 43 is smaller than that of the buffer layer 41. That is, a tensile strain is generated at thermal equilibrium in the electron supply layer 43. The channel layer 42 is formed on a (000-1) Ga-face crystal plane of the buffer layer 41.

A 2DEG layer 46 is formed in the channel layer 42 and a source electrode 441 and a drain electrode 442, those being coupled electrically to the 2DEG layer 46, are formed in an opposing manner.

An insulation film 47 is formed over the electron supply layer 43 and a gate electrode 45 is formed in the manner of being embedded into an opening 48 formed in the insulation film 47. The gate electrode 45 is formed so as to cover the insulation film 47 at the source side end part and the drain side end part thereof and has a shape of eaves. The eave-shaped parts function as a so-called field plate.

A semiconductor layered structure according to the present embodiment has a strain layer formed by N plane growth with a growth direction of [000-1] crystallographic axis in which the bandgap of the electron supply layer 43 is larger than that of the channel layer 42; and the A-axis length of the electron supply layer 43 is smaller than that of the buffer layer 41.

Consequently in the present embodiment, on the basis of the principle similar to the third embodiment, the internal strain of the electron supply layer 43 at thermal equilibrium and the strain deviation accompanying inverse piezoelectric effect offset each other and hence a strain energy when a voltage is applied is inhibited.

In the present embodiment further, electric field concentration generated at the drain side end of the gate is alleviated by the effect of a field plate. Consequently, the vertical direction electric field component F3 decreases and a strain energy caused by inverse piezoelectric effect is further inhibited from increasing in accordance with the expression (12).

Figure 13:
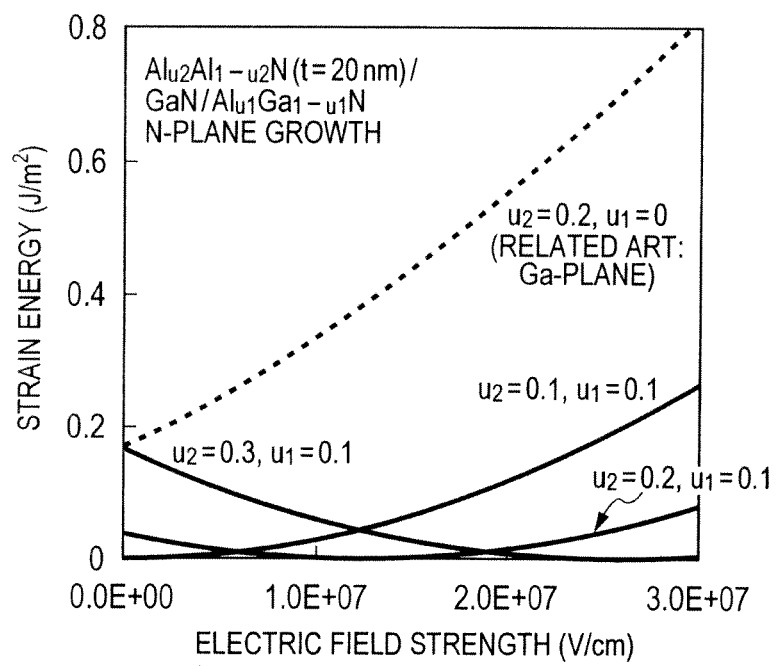
FIG. 13 is a graph showing the computation result of the dependency of a strain energy on an electric field strength according to the fourth embodiment of the present invention.
Figure 14:
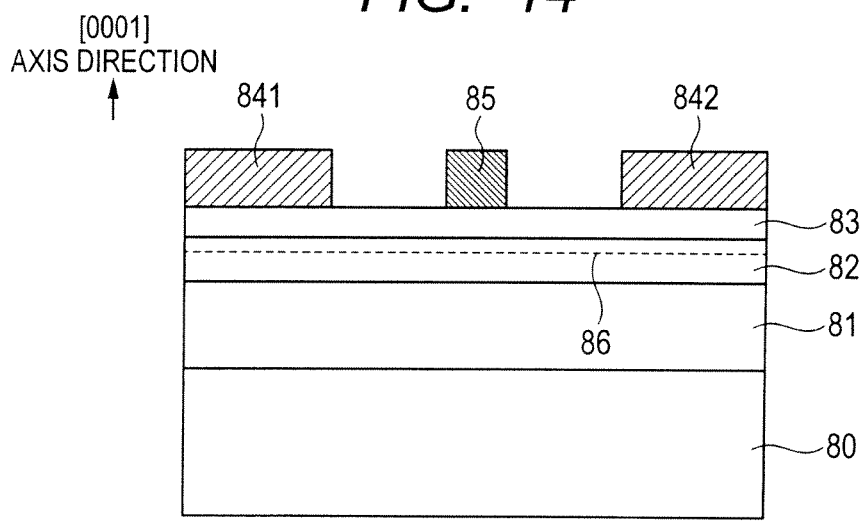
FIG. 14 is a view showing the device structure of an FET according to Related Art 1.
Figure 15:
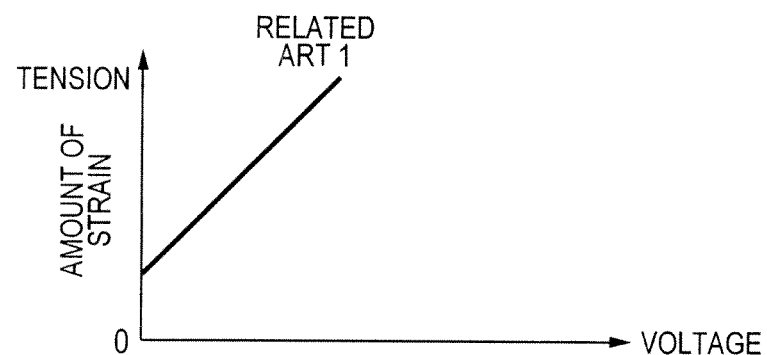
FIG. 15 is a graph schematically showing the dependency of an internal strain on a voltage in an FET according to Related Art 1.
Figure 16:
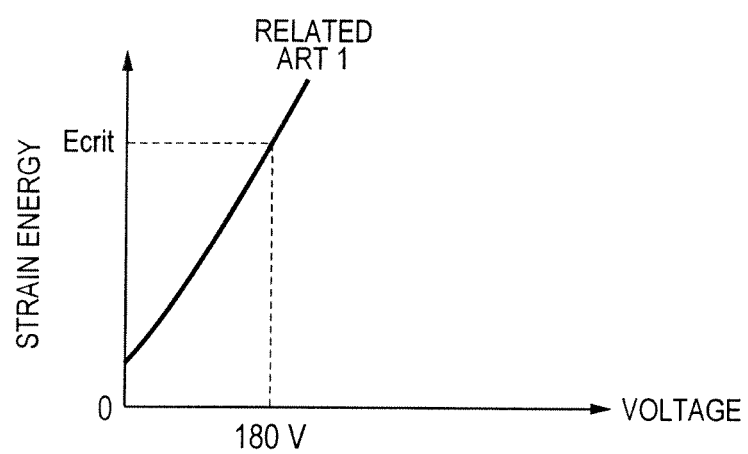
FIG. 16 is a graph schematically showing the dependency of a strain energy on a voltage in an FET according to Related Art 1.
Figure 17:
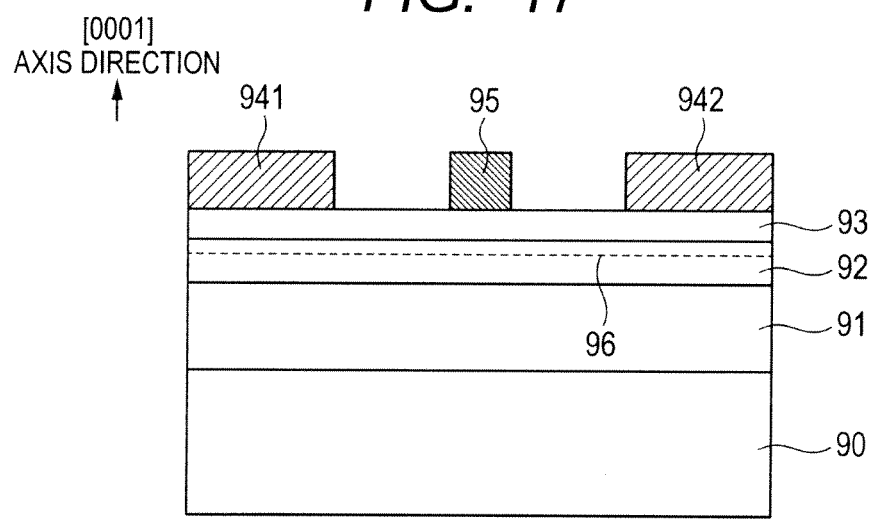
FIG. 17 is a view showing the device structure of an FET according to Related Art 2.
Figure 18:
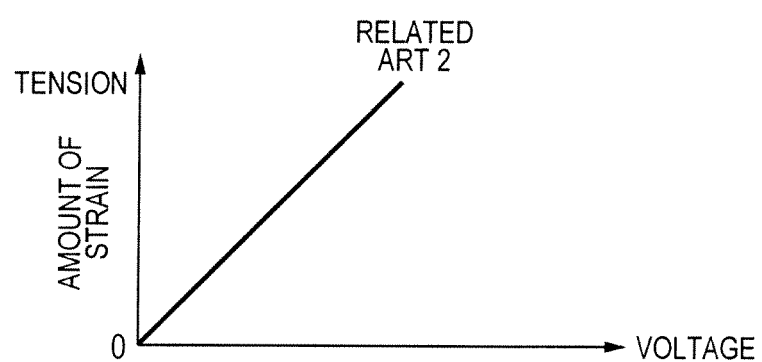
FIG. 18 is a graph schematically showing the dependency of an internal strain on a voltage in an FET according to Related Art 2.
Figure 19:
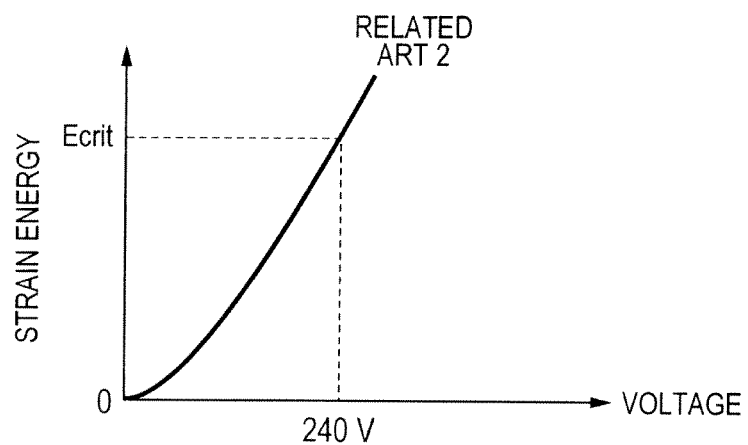
FIG. 19 is a graph schematically showing the dependency of a strain energy on a voltage in an FET according to Related Art 2.

FIG. 13 is a graph showing the computation result of the dependency of a strain energy on a vertical direction electric field strength when the Al composition ratio u$_2$ of an electron supply layer 43 comprising Al$_{u2}$Ga$_{1-u2}$N is varied in an FET structure shown in FIG. 12. The Al composition ratio u$_1$ of a buffer layer 41 comprising Al$_{u1}$Ga$_{1-u1}$N is fixed to 0.1. In FIG. 13, the dotted line (u$_2$=0.2, u$_1$=0) shows the dependency of a strain energy on a vertical direction electric field strength in an FET (Ga plane growth) according to Related Art 1.

As a result of analyses, it is found that a tentative effect of offsetting a strain energy can be obtained if the Al composition ratio u$_1$ of a buffer layer and the Al composition ratio u$_2$ of an electron supply layer 43 satisfy the expression u$_i$<u$_2$.

As a result of further analyses, it is found that it is possible to minimize the strain energy in the interior of an FET when the value of u$_2$-u$_1$ is set at about 0.1 as the result of u$_2$=0.2, u$_1$=0.1 shows in FIG. 13. In a practical application, when the expression 0.05<u$_2$-u$_1$<0.15 is satisfied, intended functions and effects can be obtained sufficiently.

A manufacturing method of an FET according to the present embodiment is explained hereunder (here, the case of u$_2$=0.1 and u$_1$=0.0).

A nucleation layer 200 nm in thickness (not shown in the figure) comprising a superlattice formed by stacking undoped AlN and undoped GaN alternately, a buffer layer 41 (layer thickness: 1 μm) comprising undoped GaN, a channel layer 42 (layer thickness: 50 nm) comprising undoped GaN, and an electron supply layer 43 (layer thickness: 20 nm) comprising n-type Al$_{0.1}$Ga$_{0.9}$N are grown in this order over a (111) plane Si substrate 40 for example by an MOCVD method.

Here, the semiconductor layered structure is formed by N plane growth in which a growth direction is parallel with a [000-1] crystallographic axis. The channel layer 42 is grown on a (000-1) N-face crystal plane of the buffer layer 41.

The thicknesses of the electron supply layer 43 comprising $Al_{0.1}Ga_{0.9}N$ is set so as to be thinner than a critical film thickness of generating dislocations over the buffer layer 41 comprising GaN. By so doing, it is possible to obtain a good crystal quality of inhibiting dislocations from being generated.

Si for example is used as an n-type impurity added to the electron supply layer 43 comprising $Al_{0.1}Ga_{0.9}N$ and the concentration of the impurity is set at about $5 \times 10^{18}$ cm$^{-3}$ for example.

On the basis of spontaneous polarization effect and piezoelectric polarization effect, negative electric charge having an area density of about $5 \times 10^{12}$ cm$^{-2}$ is generated at the interface between an electron supply layer (AlGaN) 43 and a channel layer (GaN) 42. Since an n-type impurity of a high concentration is added to the electron supply layer 43 however, a 2DEG layer 46 is formed in the GaN channel layer 42.

A source electrode 441 and a drain electrode 442 are formed respectively over the electron supply layer 43 for example by evaporating and alloying a metal such as Ti/Al/Ni/Au and are in ohmic contact with the 2DEG layer 46.

Successively, device isolation is applied by ion implantation of N or the like.

Subsequently, an insulation film 47 (60 nm) comprising $Si_3N_4$ is formed for example by a PECVD method.

After an opening pattern is formed by an ordinary photolithography method, an opening 48 is formed by removing the insulation film 47 and exposing the electron supply layer 43 for example by a dry etching method with a reactive gas such as $SF_6$.

Successively, a gate electrode 45 is formed in the manner of being embedded into the opening 48 for example by evaporating and lifting off a metal such as Ni/Au. Such an FET as shown in FIG. 12 is manufactured in this way.

Although the present invention has been explained in accordance with the above embodiments, it is a matter of course that the present invention is not limited to the above embodiments and includes various embodiments corresponding to the principles of the present invention.

For example, although Si is used as a substrate in the above embodiments, another substrate comprising silicon carbide (SiC), sapphire ($Al_2O_3$), GaN, diamond (C), or the like may be adopted.

Although a superlattice of AlN and GaN is used as a nucleation layer in the above embodiments, a single layer of AlN, AlGaN, GaN, or the like may be used.

Although GaN or AlGaN is used as the material of a buffer layer in the above embodiments, another group-III nitride semiconductor comprising AlN, indium gallium nitride (InGaN), InAlN, InAlGaN, or the like may be used.

Although GaN is used as the material of a channel layer in the above embodiments, another group-III nitride semiconductor having a bandgap smaller than an electron supply layer may be used. For example, another group-III nitride semiconductor comprising AlGaN, InAlN, InAlGaN, InGaN, indium nitride (InN), or the like may be adopted.

Although InAlN or AlGaN is used as the material of an electron supply layer in the above embodiments, another group-III nitride semiconductor having a bandgap larger than a channel layer may be adopted. For example, AlN, GaN, InAlGaN, InGaN, or the like may be adopted.

Although an electron supply layer is undoped or an n-type in the above embodiments, a multi-layered structure such as a double-layered structure comprising an undoped layer and an n-type layer or a triple-layered structure comprising an undoped layer, an n-type layer, and an undoped layer may be adopted.

Although $Si_3N_4$ is used as an insulation film in the above embodiments, another insulating material comprising aluminum oxide ($Al_2O_3$), silicon oxide ($SiO_2$), or the like may be used.

Although Ti/Al/Ni/Au is used as the material of a source electrode and a drain electrode in the above embodiments, another material such as Ti/Al, Ti/Al/molybdenum (Mo)/Au, or Ti/Al/niobium (Nb)/Au may be used.

Although Ni/Au is used as the material of a gate electrode in the above embodiments, another material such as Ni/palladium (Pd)/Au, Ni/platinum (Pt)/Au, Ti/Au, Ti/Pd/Au, or Ti/Pt/Au may be used.

Although a gate electrode is formed on an electron supply layer in the above embodiments, for example a cap layer several nm in thickness comprising a group-III nitride semiconductor such as AlN, AlGaN, GaN, InAlN, InAlGaN, InGaN, or InN may be interposed between the electron supply layer and the gate electrode.

Although a channel layer is formed on an electron supply layer in the above embodiments, for example a spacer layer several nm in thickness comprising a group-III nitride semiconductor such as AlN, AlGaN, GaN, InAlN, InAlGaN, InGaN, or InN may be interposed between the electron supply layer and the channel layer.

Although a Schottky type gate is formed by forming a gate electrode on an electron supply layer in the above embodiment, a metal-insulation film-semiconductor (MIS) type gate formed by interposing an insulation film of $Al_2O_3$, $SiO_2$, $Si_3N_4$, or the like between the electron supply layer and the gate electrode may be used.

Although device isolation is applied by ion implantation of N or the like in the above embodiments, another ion such as boron (B) may be used for the ion implantation. Otherwise, the device isolation may be applied by mesa etching.

Although a protection film is not formed over the outermost surface of a device in the above embodiments, a protection film comprising an insulating material such as $Si_3N_4$, $SiO_2$, or $Al_2O_3$ may be formed.

The present invention makes it possible to obtain an FET comprising a nitride semiconductor of a high degradation commencement voltage and contributes largely to the improvement in the performance of electronic devices used for a portable phone base-station, fixed radio transmission equipment, a digital broadcasting ground-based station, radar equipment, a motor controller, a high-frequency generator, power supply equipment, an inverter illumination lamp, and the like.

The disclosures in aforementioned Patent Literatures and Nonpatent Literatures are incorporated in the present specification by reference. It is possible to modify and adjust embodiments within the tenor of all the disclosures (including claims) in the present invention and further on the basis of the basic technological thought thereof. Further, it is possible to variously combine or select various disclosure components within the scope of claims in the present invention. That is, it is a matter of course that the present invention includes various modifications and amendments that can be done by those skilled in the art in accordance with all the disclosures including claims and technological thought.

What is claimed is:

1. A semiconductor device equipped with a field effect transistor, the field effect transistor comprising:
    a semiconductor layered structure including a buffer layer provided over a substrate, a channel layer provided over the buffer layer, and an electron supply layer provided over the channel layer, each layer comprising group-III nitride semiconductors;

a source electrode being electrically coupled to the channel layer;

a drain electrode being electrically coupled to the channel layer; and a gate electrode formed over the electron supply layer, wherein the buffer layer, the channel layer, and the electron supply layer are formed in a group-III atomic plane growth mode parallel with a [0001] crystallographic axis over the substrate, and wherein the electron supply layer has an A-axis length larger than that of the buffer layer has a bandgap larger than that of the channel layer.

2. A semiconductor device equipped with a field effect transistor, the field effect transistor comprising:

a semiconductor layered structure including a buffer layer provided over a substrate, a channel layer provided over the buffer layer, and an electron supply layer provided over the channel layer, each layer comprising group-III nitride semiconductors;

a source electrode being electrically coupled to the channel layer;

a drain electrode being electrically coupled to the channel layer; and a gate electrode formed over the electron supply layer, wherein the buffer layer, the channel layer, and the electron supply layer are formed in a group-V atomic plane growth mode parallel with a [000-1] crystallographic axis over the substrate with group-III nitride semiconductors respectively, and wherein the electron supply layer has an A-axis length smaller than that of the buffer layer and has a bandgap larger than that of the channel layer.

3. The semiconductor device according to claim 1, wherein the buffer layer comprises GaN, the channel layer comprises GaN, and the electron supply layer comprises $In_xAl_{1-x}N$ ($0.18<x<0.53$) having a compressive strain.

4. The semiconductor device according to claim 1, wherein the buffer layer comprises $Al_{z1}Ga_{1-z1}N$ ($0<z_1\leq 1$), the channel layer comprises GaN, and the electron supply layer comprises $Al_{z2}Ga_{1-z2}N$ ($0\leq z_2<1$, $z_2<z_1$) having a compressive strain.

5. The semiconductor device according to claim 2, wherein the buffer layer comprises GaN, the channel layer comprises GaN, and the electron supply layer comprises $In_yAl_{1-y}N$ ($0<y<0.17$) having a tensile strain.

6. The semiconductor device according to claim 2, wherein the buffer layer comprises $Al_{u1}Ga_{1-u1}N$ ($0\leq u_1<1$), the channel layer comprises GaN, and the electron supply layer comprises $Al_{u2}Ga_{1-u2}N$ ($0<u_2\leq 1$, $u_1<u_2$) having a tensile strain.

7. The semiconductor device according to claim 3, wherein the electron supply layer comprises $In_xAl_{1-x}N$ ($0.19<x<0.25$) whose axis length has a compressive strain.

8. The semiconductor device according to claim 4, wherein the electron supply layer comprises $Al_{z2}Ga_{1-z2}N$ ($0\leq z_2<1$, $0.05<z_1-z_2<0.15$) having a compressive strain.

9. The semiconductor device according to claim 5, wherein the electron supply layer comprises $In_yAl_{1-y}N$ ($0.1<y<0.16$) having a tensile strain.

10. The semiconductor device according to claim 6, wherein the electron supply layer comprises $Al_{u2}Ga_{1-u2}N$ ($0<u_2 1$, $u_1<u_2$, $0.05<u_2-u_1<0.15$) having a tensile strain.

11. The semiconductor device according to claim 1, wherein the field effect transistor comprises an insulation film over the electron supply layer, a lower part of the gate electrode is embedded into an opening formed in the insulation film, and sides of the upper part thereof opposing the source electrode and the drain electrode respectively protrude toward the source electrode side and the drain electrode side and cover the insulation film.

12. The semiconductor device according to claim 1, wherein the channel layer is formed on a (0001) Ga-face crystal plane of the buffer layer.

13. The semiconductor device according to claim 2, wherein the channel layer is formed on a (000-1) N-face crystal plane of the buffer layer.

14. The semiconductor device according to claim 1, wherein the buffer layer is subjected to lattice relaxation.

15. The semiconductor device according to claim 14, further comprising a nucleation layer provided over the substrate with the buffer layer provided over the nucleation layer.

16. The semiconductor device according to claim 15, wherein the nucleation layer includes at least one of AlN, AlGaN, and GaN.

17. The semiconductor device according to claim 16, wherein the channel layer has a thickness smaller than that of the buffer layer.

18. The semiconductor device according to claim 17, wherein the nucleation layer has a thickness smaller than that of the buffer layer and larger than that of the channel layer.

19. The semiconductor device according to claim 2, wherein the buffer layer is subjected to lattice relaxation.

20. The semiconductor device according to claim 19, further comprising a nucleation layer provided over the substrate with the buffer layer provided over the nucleation layer.

21. The semiconductor device according to claim 20, wherein the nucleation layer includes at least one of AlN, AlGaN, and GaN.

22. The semiconductor device according to claim 20, wherein the channel layer has a thickness smaller than that of the buffer layer.

23. The semiconductor device according to claim 22, wherein the nucleation layer has a thickness smaller than that of the buffer layer and larger than that of the channel layer.

24. The semiconductor device according to claim 2, wherein the field effect transistor comprises an insulation film over the electron supply layer, a lower part of the gate electrode is embedded into an opening formed in the insulation film, and sides of the upper part thereof opposing the source electrode and the drain electrode respectively protrude toward a source electrode side and a drain electrode side, and cover the insulation film.

* * * * *